(12) United States Patent
Huang et al.

(10) Patent No.: US 12,009,033 B2
(45) Date of Patent: Jun. 11, 2024

(54) ONON SIDEWALL STRUCTURE FOR MEMORY DEVICE AND METHOD FOR MAKING THE SAME

(71) Applicant: Taiwan Semiconductor Manufacturing Company Limited, Hsinchu (TW)

(72) Inventors: Chen-Ming Huang, Tainan (TW); Wen-Tuo Huang, Tainan (TW); Yu-Hsiang Yang, Tainan (TW); Yu-Ling Hsu, Tainan (TW); Wei-Lin Chang, Changhua (TW); Chia-Sheng Lin, Tainan (TW); ShihKuang Yang, Tainan (TW); Yu-Chun Chang, Tainan (TW); Hung-Ling Shih, Tainan (TW); Po-Wei Liu, Tainan (TW); Shih-Hsien Chen, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/337,498

(22) Filed: Jun. 20, 2023

(65) Prior Publication Data

US 2023/0335196 A1 Oct. 19, 2023

Related U.S. Application Data

(63) Continuation of application No. 17/459,330, filed on Aug. 27, 2021, now Pat. No. 11,854,621.

(51) Int. Cl.
*G11C 16/04* (2006.01)
*G11C 16/10* (2006.01)
(Continued)

(52) U.S. Cl.
CPC .......... *G11C 16/10* (2013.01); *H01L 29/6656* (2013.01); *H01L 29/7841* (2013.01); *H10B 41/35* (2023.02); *G11C 16/04* (2013.01)

(58) Field of Classification Search
CPC ............................. G11C 16/0483; G11C 29/82
See application file for complete search history.

(56) References Cited

U.S. PATENT DOCUMENTS

| 5,751,631 A * | 5/1998 | Liu | H10B 69/00 |
| | | | 257/E27.103 |
| 2012/0044736 A1 * | 2/2012 | Chung | H10B 61/10 |
| | | | 365/72 |

(Continued)

FOREIGN PATENT DOCUMENTS

TW    I353640 B    12/2011

OTHER PUBLICATIONS

Taiwan Patent and Trademark Office; Application No. 110147060; Office Action dated Aug. 26, 2022; 12 pages.

*Primary Examiner* — Jason Lappas
(74) *Attorney, Agent, or Firm* — The Marbury Law Group, PLLC

(57) ABSTRACT

A memory device and method of making the same are disclosed. The memory device includes transistor devices located in both a memory region and a logic region of the device. Transistor devices in the memory region include sidewall spacers having a first oxide layer over a side surface of a gate structure, a first nitride layer over the first oxide layer, a second oxide layer over the first nitride layer, and a second nitride layer over the second oxide layer. Transistor devices in the logic region include sidewall spacers having a first oxide layer over a side surface of a gate structure, a first nitride layer over the first oxide layer, and a second nitride layer over the first nitride layer.

20 Claims, 12 Drawing Sheets

(51) Int. Cl.
*H01L 29/66* (2006.01)
*H01L 29/78* (2006.01)
*H10B 41/35* (2023.01)

(56) References Cited

U.S. PATENT DOCUMENTS

2015/0380407 A1 12/2015 Ji et al.
2019/0355677 A1 11/2019 Matsubara

* cited by examiner

ONON SIDEWALL STRUCTURE FOR MEMORY DEVICE AND METHOD FOR MAKING THE SAME

RELATED APPLICATION

The present application is a continuation application of U.S. patent application Ser. No. 17/459,330 entitled "ONON Sidewall Structure for Memory Device and Methods of Making the Same," filed on Aug. 27, 2021, the entire contents of which are incorporated herein by reference for all purposes.

BACKGROUND

Integrated circuit memory devices, such as metal oxide semiconductor field effect transistor (MOSFET) memory devices, typically include at least one memory region and at least one logic region. Both the memory region and the logic region may include transistors. The transistors of the memory region may form memory cells that are configured to store state information, i.e., bits. The transistors of the logic region may be electronically coupled to the memory region and may be utilized for various operations of the memory device, such as for selecting individual memory cells and/or groups of memory cells (i.e., for performing read, write and/or erase operations), for power control and/or for input/output (I/O) functionality One type of memory device is a multi-time programmable (MTP) memory device. MTP memory devices are designed so that the individual memory cells may be programmed and reprogrammed a large number of times, such as up to 1 million write cycles over the life of the device. In MTP memory devices, the memory cells require high data retention performance over the life of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
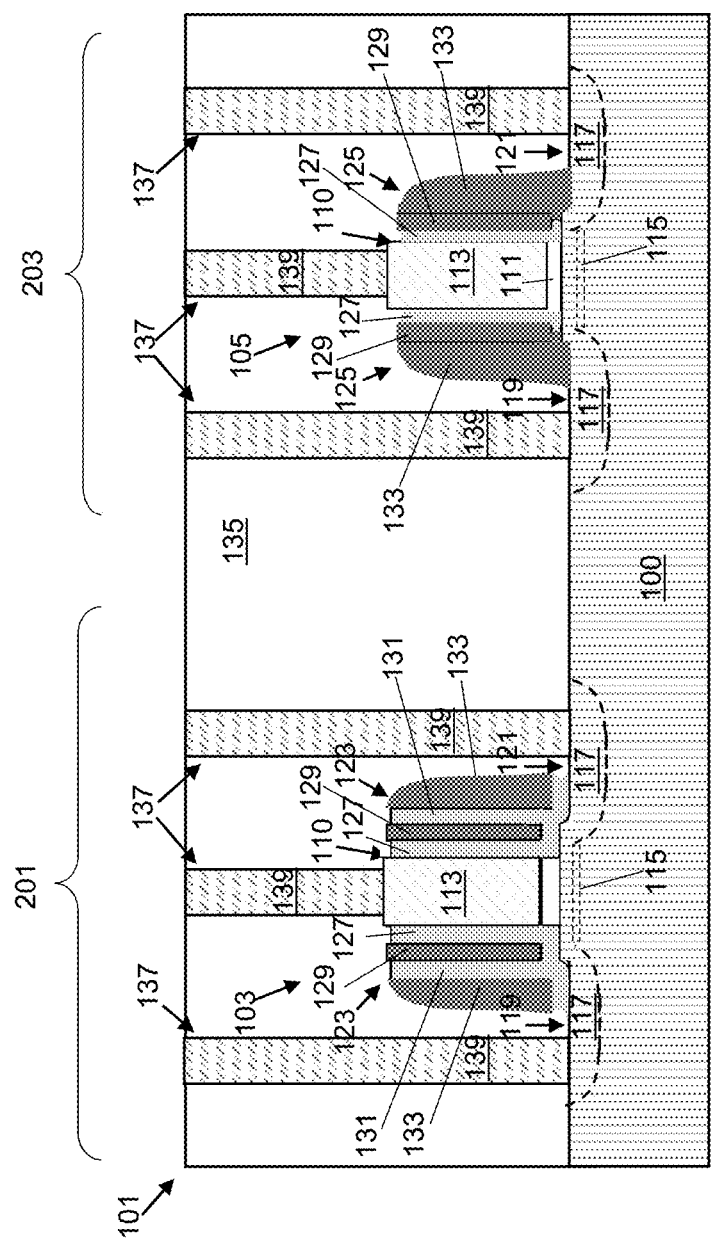
FIG. 1 is a vertical cross-sectional schematic view of a memory device including transistor devices having sidewall spacers with an oxide-nitride-oxide-nitride (ONON) structure in a memory region and an oxide-nitride-nitride (ONN) structure in a logic region in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form a memory device, such as a multi-time programmable (MTP) memory device. A memory device in accordance with various embodiments may include a plurality of transistors, such as metal oxide semiconductor field effect transistors (MOSFETs), formed on a substrate. The transistors may form an array of independently functioning memory cells, which may be located in one or more memory regions of the memory device. The memory device may also include one or more logic devices, which may include, for example, memory selectors, power gates and input/output elements. The logic devices may also include transistors (e.g., MOSFETs) that may be formed on the same substrate as the transistors of the memory region (s). The logic devices may be located in one or more logic regions of the memory device.

Memory devices may include volatile memory cells or nonvolatile (NV) memory cells. One common architecture for nonvolatile memory cells utilizes floating-gate MOSFET technology, in which the memory cell includes a transistor having a floating gate that stores a bit by the presence or absence of a charge. Other nonvolatile memory technologies include resistive random-access memory (RRAM or ReRAM), magnetic/magneto-resistive random-access memory (MRAM), ferroelectric random-access memory (FeRAM), and phase-change memory (PCM), for example.

A multi-time programmable (MTP) memory device may include memory cells that may be programmed and reprogrammed many times. However, a known issue with these types of memory devices is that the data retention performance of the memory cells may degrade as the number of write cycles of the memory cells increases. This degradation may be at least partially due to current leakage paths forming in the memory cell transistors, particularly through the sidewall spacers that surround and electrically isolate the gate structure of the transistor.

In order to address the issue of current leakage paths and improve data retention characteristics in a memory device, such as an MTP memory device, the various embodiments disclosed herein include transistors in a memory region of the device that include a sidewall spacer for a gate structure that may be formed using alternating oxide and nitride layers. In particular, in some embodiments, a sidewall spacer may include a first oxide layer formed over a side surface of the gate structure, a first nitride layer formed over the first oxide layer, a second oxide layer formed over the first nitride layer, and a second nitride layer formed over the second oxide layer. The second oxide layer may have a thickness that is greater than 5 nm, such as between 5 nm and 20 nm. This alternating oxide/nitride/oxide/nitride sidewall spacer configuration may be referred to as an "ONON" structure.

Various embodiments may include a memory device in which at least some of the transistors in the memory region (s) include sidewall spacers having an ONON structure as described above. However, transistors in the logic region(s) of the memory device may include sidewall spacers that do not have an ONON structure. In embodiments, the transistors in the logic region(s) of the memory device may have a sidewall spacer including an oxide layer formed over a side surface of the gate structure, a first nitride layer formed over the oxide layer and a second nitride layer formed over the first nitride layer (i.e., an "ONN" structure). The sidewall spacers in the logic region(s) of the memory device may have either no oxide layer between the first nitride layer and the second nitride layer, or a thin (e.g., <1.5 nm) layer of native oxide material between the first nitride layer and the second nitride layer.

A method of fabricating a memory device according to the various embodiments may include forming a first oxide layer, a first nitride layer and a second oxide layer over gate structures in both the memory region and the logic region of the memory device, forming an etch mask over the memory region but not over the logic region, and removing, via an etching process, the second oxide layer from the logic region while the etch mask prevents the second oxide layer from being removed in the memory region. The etch mask may then be removed from the memory region to expose the second oxide layer, and a second nitride layer may be formed over the second oxide layer in the memory region and over the first nitride layer in the logic region. This may provide sidewall spacers having an oxide/nitride/oxide/nitride (ONON) structure in the memory region and sidewall spacers having an oxide/nitride/nitride (ONN) structure in the logic region of the memory device. The sidewall spacers having an ONON structure in the memory region may inhibit the formation of current leakage paths and improve data retention performance of the memory device. At the same time, the sidewall spacers having an ONN structure in the logic region do not affect performance of the logic devices.

FIG. 1 schematically illustrates an exemplary structure of a memory device 101 according to one embodiment of the present disclosure. The exemplary structure includes a substrate 100 that contains a semiconductor material layer. The substrate 100 may include a bulk semiconductor substrate, such as a silicon substrate, in which the semiconductor material layer continuously extends from a top surface of the substrate 100 to a bottom surface of the substrate 100, or a semiconductor-on-insulator layer including the semiconductor material layer as a top semiconductor layer overlying a buried insulator layer (such as a silicon oxide layer).

The exemplary structure may include various device regions, which may include at least one memory region 201 and at least one logic region 203. Semiconductor devices such as field effect transistors may be formed on, and/or in, the semiconductor material layer of the substrate 100. The exemplary structure illustrates a first transistor 103 located in the memory region 201 and a second transistor 105 located in the logic region 203. Although a single transistor is shown in each of the memory region 201 and the logic region 203, it will be understood that a memory device 101 typically includes a plurality of transistors located in each of the memory region 201 and the logic region 203. Transistors 103 in the memory region 201 may form the memory cells of the memory device 101, such as an MPT memory device. Transistors 105 in the logic region 203 may form logic devices, such as memory selectors, power gates and input/ output elements, of the memory device 101.

Transistors 103 and 105 may be field effect transistors. Each field effect transistor 103, 105 may include a gate structure 110, a semiconductor channel 115, and a pair of active regions 117 (one of which functions as a source region 119 and another of which functions as a drain region 121). The active regions 117 may be formed in the semiconductor material layer of the substrate 100 via one or more ion implantation steps. The active regions 117 may be doped either p-type or n-type as desired. Example n-type dopants include, but are not limited to, antimony, arsenic and phosphorous. Example p-type dopants include, but are not limited to boron, aluminum and gallium. The active regions 117 may have an implanted ion concentration of $2 \times 10^{20}$ to $2 \times 10^{21}$, although greater or lesser ion concentrations may also be used.

The gate structure 110 may located over the top surface of the substrate 100 and between the source region 119 and the drain region 121. The semiconductor channel 115 may be located beneath the gate structure 110 in the semiconductor material layer of the substrate 100, and may extend between the source region 119 and the drain region 121. The gate structure 110 may include a patterned gate dielectric layer 111 over the top surface of the substrate 100, and a patterned gate 113 above the gate dielectric layer 111. The patterned gate dielectric layer 111 may be made of any suitable material, including an oxide or nitride, such as silicon oxide. Other suitable gate dielectric materials are within the contemplated scope of disclosure. The patterned gate 113 may be made of a metal, such as tungsten, nickel, aluminum or alloys thereof. Alternately or in addition, the patterned gate 113 may be made of a doped semiconductor material, such as p-doped polysilicon or n-doped polysilicon. Other suitable gate materials are within the contemplated scope of disclosure.

In some embodiments, the gate structure 110 of the transistors 103 in the memory region 201 may include additionally include a floating gate (not illustrated) over the patterned gate dielectric layer 111 and one or more additional dielectric layers between the floating gate and the patterned gate 113.

The transistors 103 and 105 may also include sidewall spacers 123 and 125 over the side surfaces of the gate structures 110. Each transistor 103, 105 may include a pair of sidewall spacers 123, 125 over the opposing side surfaces of the gate structures 110. As noted above, the sidewall spacers 123 in the memory region 201 of the device 101 may include a first oxide layer 127 formed over a side surface of the gate structure 110, a first nitride layer 129 formed over the first oxide layer 127, a second oxide layer 131 formed over the first nitride layer 129, and a second nitride layer 133 formed over the second oxide layer 131 (i.e., an "ONON" structure). The sidewall spacers 125 in the logic region 203 of the device 101 may include a first oxide layer 127 formed over a side surface of the gate structure 110, a first nitride layer 129 formed over the first oxide layer 127, and a second nitride layer 133 formed over the first nitride layer 129 (i.e., an "ONN" structure). The sidewall spacers 125 in the logic region 203 may not have a second oxide layer 131. Further details of the sidewall spacers 123 and 125 will be described below with reference to FIGS. 2-11.

The transistors 103 and 105 may be covered by a dielectric material layer 135 made of a dielectric material such as silicon oxide. Vias 137 may be formed through the dielectric material layer 135 and filled with an electrically conductive material, such as a metal or metal alloy, to provide contact structures 139. Each of the contact structures 139 may form an electrical contact with a respective one of the active regions 117 (i.e., source 119 and drain 121 regions) or the gate structures 110 of the transistors 103 and 105.

Figure 2:
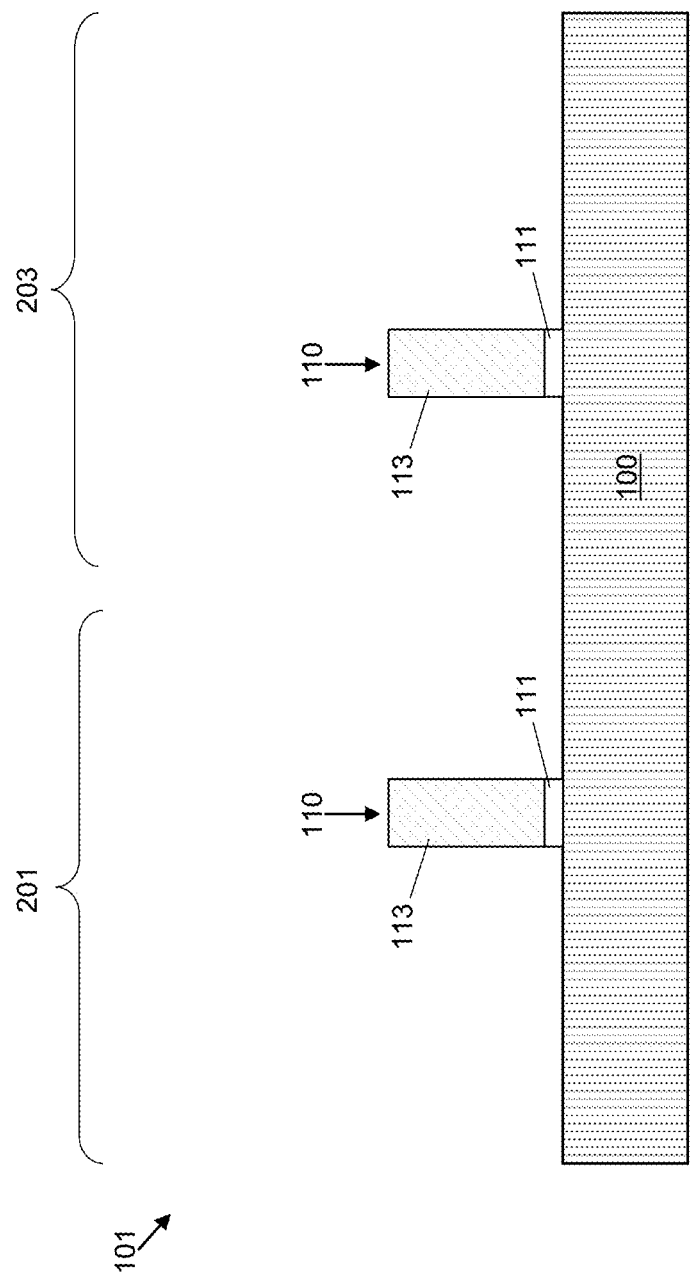
FIG. 2 is a vertical cross-sectional view illustrating an intermediate structure for making a memory device that includes plurality of transistor gate structures formed on a substrate in accordance with some embodiments.

FIG. 2 is a vertical cross-sectional view illustrating an intermediate structure for making a memory device that includes plurality of transistor gate structures formed on a substrate in accordance with some embodiments. Referring to FIG. 2, a plurality of gate structures 110 including a patterned gate dielectric layer 111 and a patterned gate 113 may be formed on a semiconductor material layer of a substrate 100. The gate structures 110 may be formed by forming a continuous layer of gate dielectric material and a continuous layer of gate material over the substrate 100 using any suitable method, such as by chemical vapor deposition (CVD), plasma enhanced chemical vapor deposition (PECVD), organometallic chemical vapor deposition (OMCVD) or atomic layer deposition (ALD). A photoresist layer (not illustrated) may be provided over the continuous layer of gate material and may be lithographically patterned to form an etch mask. The photoresist layer may include photosensitive material that may be altered when exposed to certain types of radiation. For example, the photoresist material may be positive photoresist material, in which exposure to ultraviolet (UV) radiation makes polymers contained in the photoresist material more soluble and easier to remove, or negative photoresist material, in which exposure to UV radiation makes the polymers crosslink and harder to remove. The photoresist layer may be exposed to radiation (e.g., ultraviolet (UV) light) through a photolithography mask to transfer the mask pattern to the photoresist layer. The undesired photoresist material may then be removed to form the etch mask. An etch process may then be performed to pattern the continuous layer of gate material and the continuous layer of gate dielectric material to form individual gate structures 110 on the substrate 100 as shown in FIG. 2. The photoresist etch mask may then be removed, for example, through an ashing process, dissolved, or consumed through the etch process.

Figure 3:
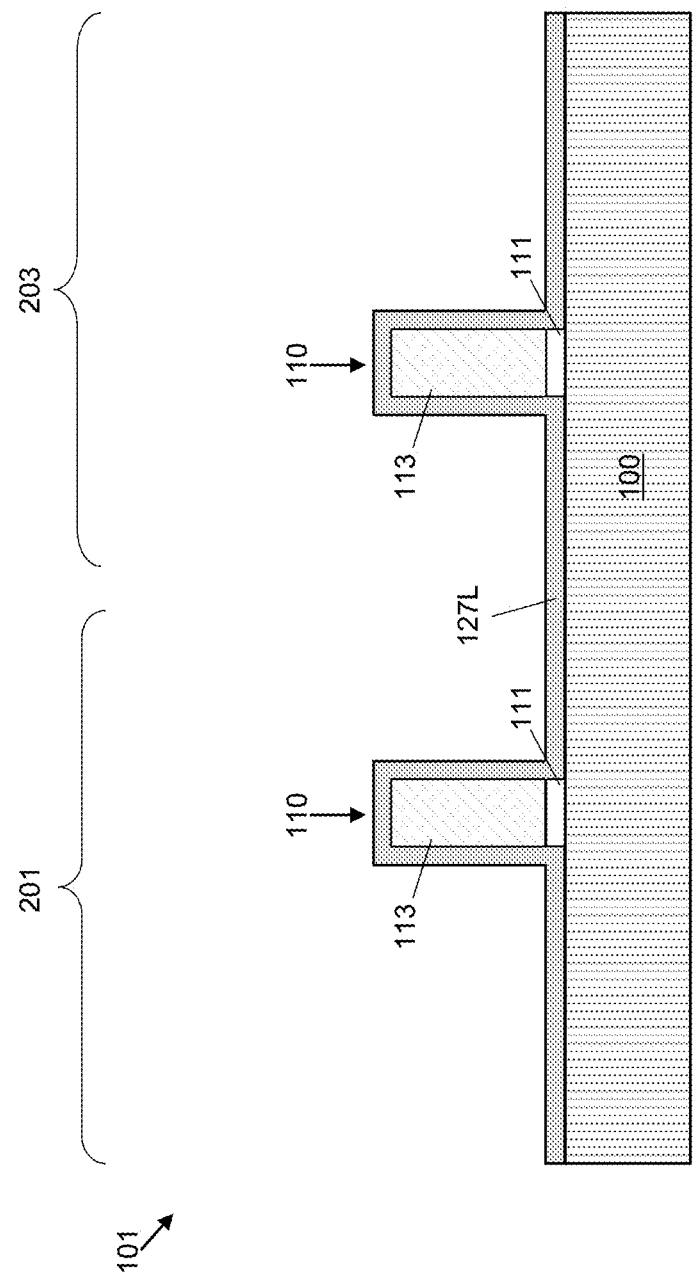
FIG. 3 is a vertical cross-sectional view illustrating a step of forming a first continuous oxide layer over the gate structures and the substrate in accordance with some embodiments.

FIG. 3 is a vertical cross-sectional view illustrating a step of forming a first continuous oxide layer over the gate structures and the substrate in accordance with some embodiments. Referring to FIG. 3, a first continuous oxide layer 127L may be formed over the gate structures 110 and the substrate 100. The first continuous oxide layer 127L may be made of silicon dioxide ($SiO_2$) Although, other suitable oxide materials may be within the contemplated scope of the disclosure. The first continuous oxide layer 127L may be conformally deposited over the gate structures 110 and the substrate 100 using any suitable method, such as by chemical vapor deposition (CVD), plasma enhanced chemical vapor deposition (PECVD), organometallic chemical vapor deposition (OMCVD) or atomic layer deposition (ALD). The first continuous oxide layer 127L may have a thickness in the range of 2 nm to 10 nm, such as between about 3 nm and 6 nm, although greater or lesser thicknesses are within the contemplated scope of disclosure.

In some embodiments, an ion implantation process may be performed to form implant regions in the semiconductor material layer of the substrate 100. The ion implantation process may be a masked ion implantation process in which a layer of photoresist may be provided over the first continuous oxide layer 127L and lithographically patterned to form a mask, as described above. Dopants of a first conductivity type (e.g., n-type dopants) may be implanted through the first continuous oxide layer 127L and into the semiconductor material layer of the substrate 100 in exposed regions of the mask. The implanted regions of the substrate 100 may form all or portions of the active regions 117 (i.e., source region(s) 119 and drain region(s) 121) in at least some of the transistors 103, 105 (see FIG. 1) of the memory device 101. In some embodiments, implant regions may be formed in a first group of transistors 103, 105 formed to have active regions 117 of the first conductivity type (e.g., n-type Metal Oxide Semiconductor (NMOS) transistors), and may not be formed in a second group of transistors 103, 105 formed to have active regions 117 of a second conductivity type (e.g., p-type Metal Oxide Semiconductor (PMOS) transistors). The mask may cover the second group of transistors during the implantation process. Following the implantation process, the photoresist may be removed using a suitable process.

Figure 4:
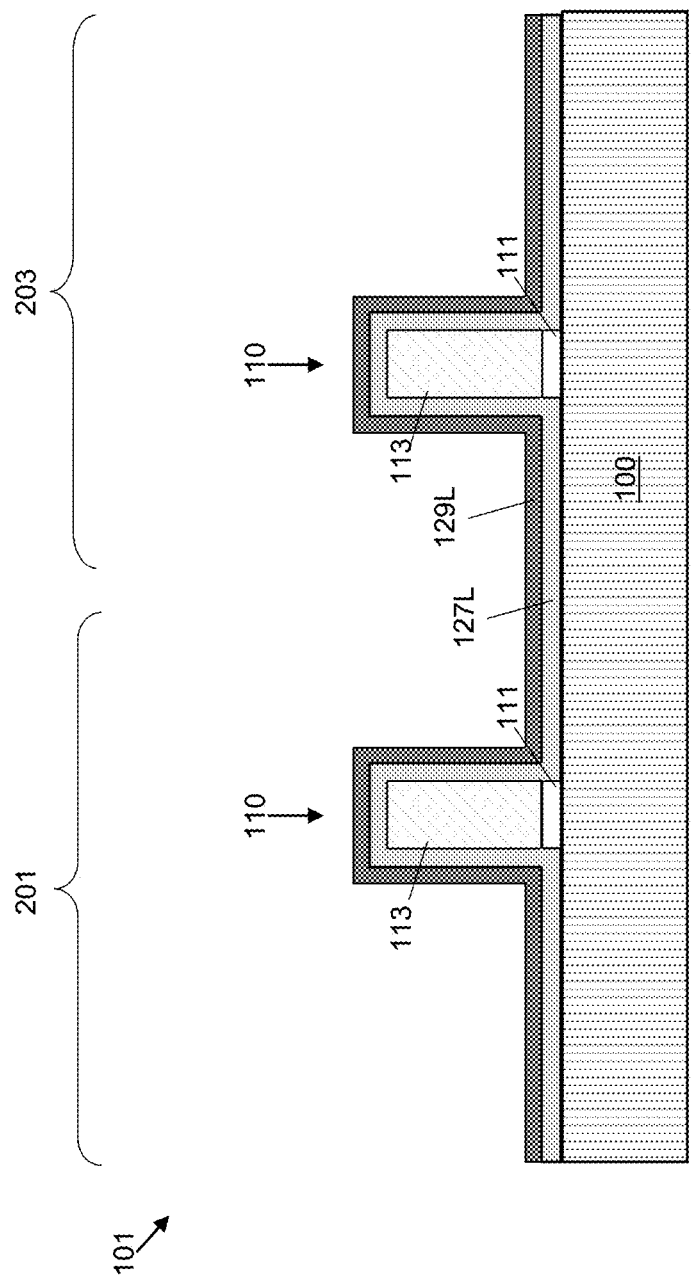
FIG. 4 is a vertical cross-sectional view illustrating a step of forming a first continuous nitride layer over the continuous oxide layer in accordance with some embodiments.

FIG. 4 is a vertical cross-sectional view illustrating a step of forming a first continuous nitride layer over the continuous oxide layer in accordance with some embodiments. Referring to FIG. 4, a first continuous nitride layer 129L may be formed over the first continuous oxide layer 127L.

The first continuous nitride layer 129L may be made of silicon nitride ($Si_3N_4$). Although, other suitable nitride materials may be within the contemplated scope of the disclosure. The first continuous nitride layer 129L may be conformally deposited over the first continuous oxide layer 127L using any suitable method, such as by chemical vapor deposition (CVD), plasma enhanced chemical vapor deposition (PECVD), organometallic chemical vapor deposition (OMCVD) or atomic layer deposition (ALD). The first continuous nitride layer 129L may have a thickness that is greater than the thickness of the first continuous oxide layer 127L. In embodiments, the first continuous nitride layer 129L may have a thickness in the range of 5 nm to 15 nm, such as between about 8 nm and 12 nm, although greater or lesser thicknesses are within the contemplated scope of disclosure.

Figure 5:
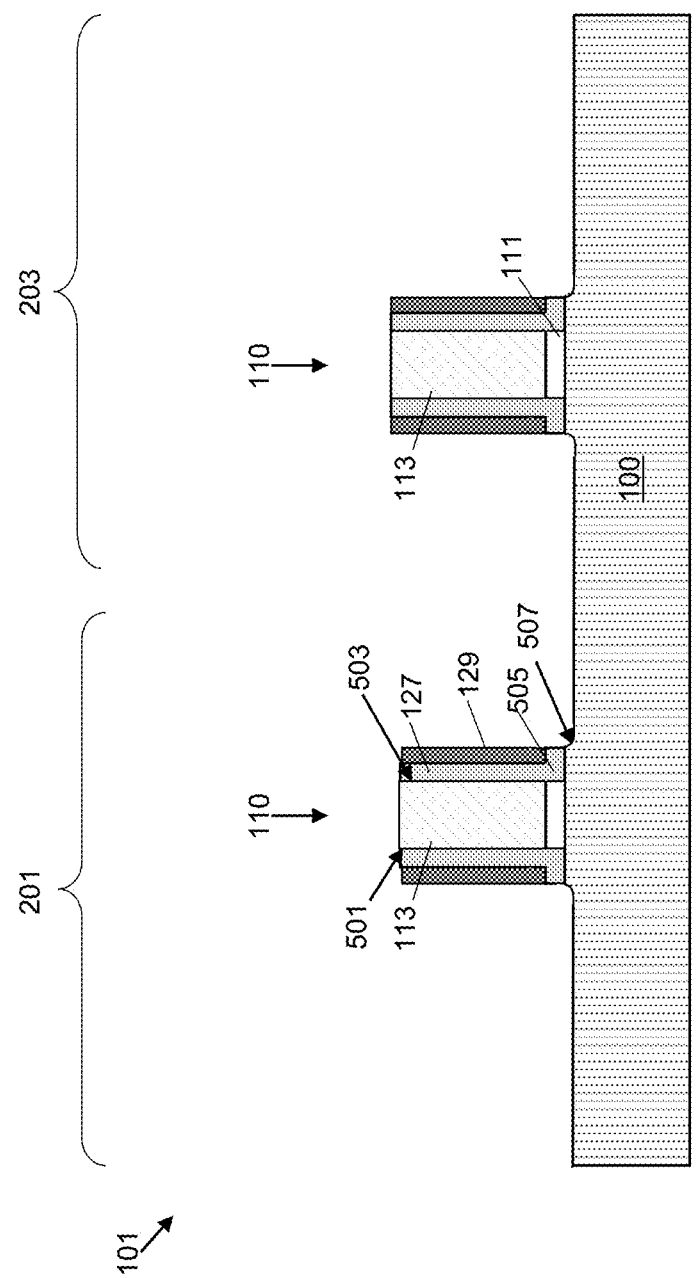
FIG. 5 is a vertical cross-sectional view illustrating a step of removing, via an etching process, portions of the first continuous oxide layer and the first continuous nitride layer to form discrete first oxide layers and first nitride layers located on the side surfaces of the gate structures in accordance with some embodiments.

FIG. 5 is a vertical cross-sectional view illustrating a step of removing, via an etching process, portions of the first continuous oxide layer and the first continuous nitride layer to form discrete first oxide layers and first nitride layers located on the side surfaces of the gate structures in accordance with some embodiments. Referring to FIG. 5, an anisotropic etch process, such as an anisotropic dry etch, may be performed to remove horizontal portions of the first continuous oxide layer 127L and the first continuous nitride layer 129L to expose the top surfaces of the gate structures 110 and portions of the substrate 100 between the gate structures 110. The remaining portions of the first continuous oxide layer 127L and the first continuous nitride layer 129L may form discrete first oxide layer 127 and first nitride layer 129 located over each of the side surfaces 501 and 503 of the gate structures 110. The first oxide layer 127 may have a thickness in the range of 2 nm to 10 nm, such as between about 3 nm and 6 nm, although greater or lesser thicknesses are within the contemplated scope of disclosure. The first nitride layer 129 may have a thickness in the range of 5 nm to 15 nm, such as between about 8 nm and 12 nm, although greater or lesser thicknesses are within the contemplated scope of disclosure.

The first oxide layer 127 may have a horizontally extending portion 505 beneath the first nitride layer 129. The horizontally extending portion 505 may be adjacent to the patterned gate dielectric layer 111 and may extend over the top surface of the substrate 100 away from the gate structure 110.

The anisotropic etch process may also remove portions of the semiconductor material layer of the substrate 100 between the gate structures 110 to leave raised mesa structures 507 on the substrate 100. Each of the gate structures 110, the first oxide layers 127, and the first nitride layers 129, may be located on a mesa structure 507.

In some embodiments, an additional ion implantation process may be performed to form implant regions in the semiconductor material layer of the substrate 100. The ion implantation process may be a masked ion implantation process in which a layer of photoresist may be provided over the gate structures 110, the first oxide layers 127, the first nitride layers 129 and the substrate 100 and lithographically patterned to form a mask, as described above. Dopants of a second conductivity type (e.g., p-type dopants) may be implanted into the semiconductor material layer of the substrate 100 in exposed regions of the mask. The implanted regions of the substrate 100 may form all or portions of the active regions 117 (i.e., source region(s) 119 and drain region(s) 121) in at least some of the transistors 103, 105 (see FIG. 1) of the memory device 101. In embodiments, implant regions may be formed in the second group of transistors 103, 105 having active regions 117 of the second conductivity type (e.g., p-type Metal Oxide Semiconductor (PMOS) transistors), and may not be formed in the first group of transistors 103, 105 that were previously implanted with dopants of the first conductivity-type, and which have active regions 117 of the first conductivity type (e.g., n-type Metal Oxide Semiconductor (NMOS) transistors). The mask may cover the first group of transistors during the implantation process. Following the implantation process, the photoresist may be removed using a suitable process.

Figure 6:
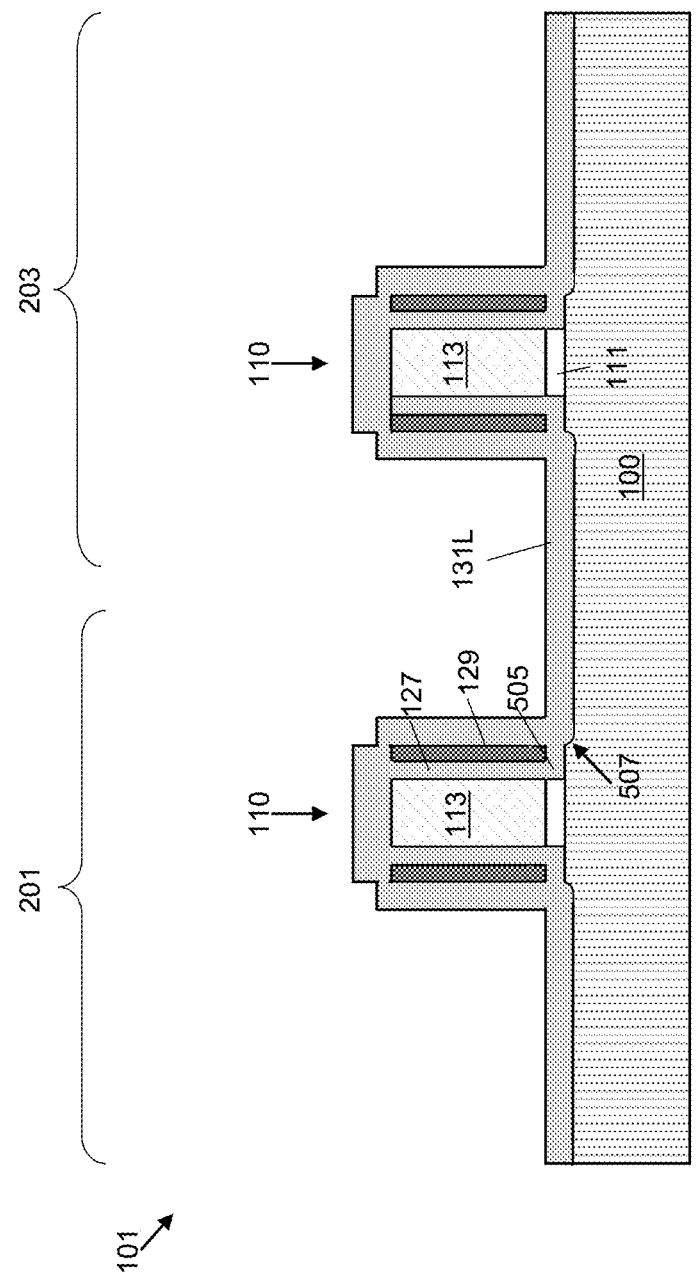
FIG. 6 is a vertical cross-sectional view illustrating a step of forming a second continuous oxide layer over the gate structures and the substrate in accordance with some embodiments.

FIG. 6 is a vertical cross-sectional view illustrating a step of forming a second continuous oxide layer over the gate structures and the substrate in accordance with some embodiments. Referring to FIG. 6, a second continuous oxide layer 131L may be formed over the gate structures 110 and the substrate 100. The second continuous oxide layer 131L may be made of silicon dioxide ($SiO_2$) However, other suitable oxide materials may be within the contemplated scope of the disclosure. The second continuous oxide layer 131L may be made of the same material or a different material than the material of the first oxide layer 127. The second continuous oxide layer 131L may be conformally deposited over the gate structures 110 and the substrate 100 using any suitable method, such as by chemical vapor deposition (CVD), plasma enhanced chemical vapor deposition (PECVD), organometallic chemical vapor deposition (OMCVD) or atomic layer deposition (ALD). The second continuous oxide layer 131L may have a thickness in the range of 5 nm to 20 nm, such as between about 9 nm and 13 nm, although greater or lesser thicknesses are within the contemplated scope of disclosure.

As shown in FIG. 6, the second continuous oxide layer 131L may be formed over the exposed top surfaces of the gate structures 110, the first oxide layers 127 and the first nitride layers 129. The second continuous oxide layer 131L may additionally extend along the side surfaces of the gate structures 110 over the first nitride layers 129 and adjacent to the horizontally extending portions 505 of the first oxide layer 127. Thus, each of the first nitride layers 129 may be surrounded on four sides by oxide material (i.e., on the top and one side by the second continuous oxide layer 131L, and on the bottom and the opposite side by the first oxide layer 127). The second continuous oxide layer 131L may additionally extend over the sides of the mesa structures 507 of the substrate 100.

Figure 7:
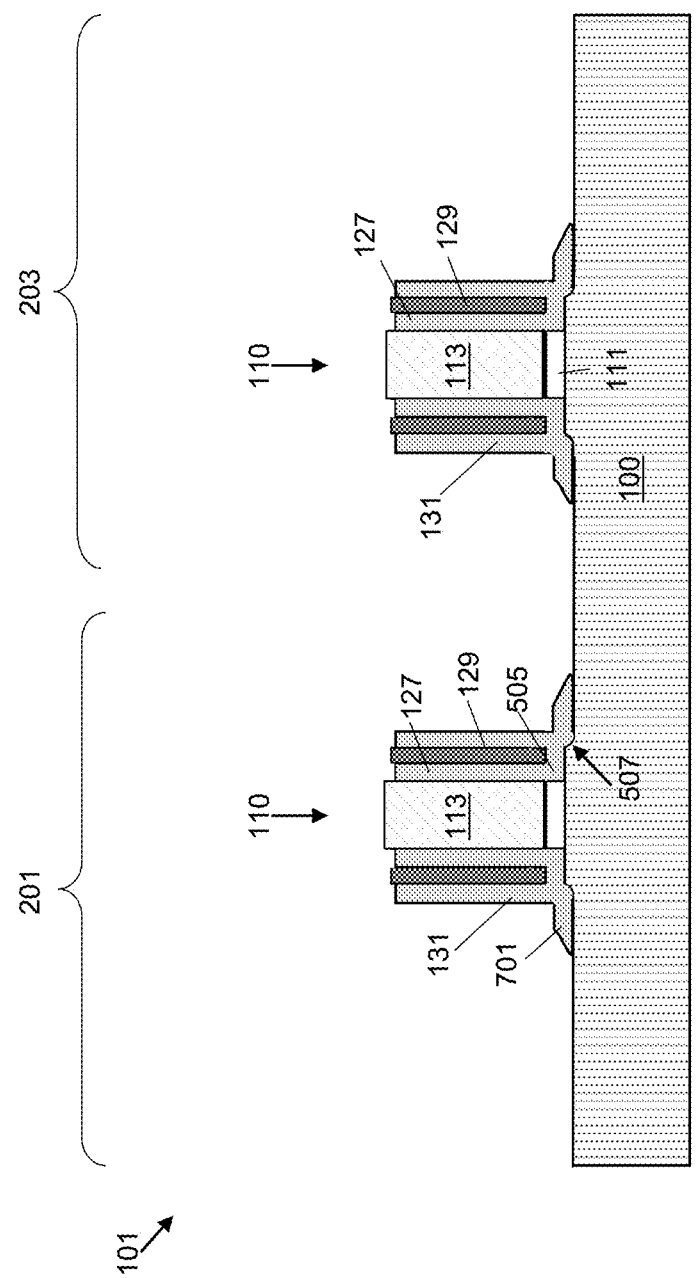
FIG. 7 is a vertical cross-sectional view illustrating a step of removing, via an etching process, portions of the second continuous oxide layer to form discrete second oxide layers over the first nitride layers on the side surfaces of the gate structures in accordance with some embodiments.

FIG. 7 is a vertical cross-sectional view illustrating a step of removing, via an etching process, portions of the second continuous oxide layer to form discrete second oxide layers over the first nitride layers on the side surfaces of the gate structures in accordance with some embodiments. Referring to FIG. 7, an anisotropic etch process, such as an anisotropic dry etch, may be performed to remove horizontal portions of the second continuous oxide layer 131L to expose the top surfaces of the gate structures 110 and portions of the substrate 100 between the gate structures 110. The remaining portions of the second continuous oxide layer 131L may form discrete second oxide layers 131 located over each of the first nitride layers 129. The removal of the horizontal portions of the second continuous oxide layer 131L may expose the top surfaces of the first nitride layers 129, so that after the etching step, the first nitride layers 129 may be surrounded on three sides by the first and second oxide layers 127 and 131. The top surfaces of the first and second oxide layers 127 and 131 may be recessed slightly from the top surface of the gate structure 110 (i.e., the top surface of patterned gate 113), as shown in FIG. 7. The top surfaces of the first and second oxide layers 127 and 131 may also be recessed slightly from the top surface of the first nitride layer 129. The top surface of the first nitride layer 129 may be recessed slightly from the top surface of the patterned gate 113. Thus, the top surface of the patterned gate 113 may have a height that is greater than the height of the top surface of the first nitride layer 129, and the top surface of the first nitride layer 129 may have a height that is greater than the height of the top surfaces of the first and second oxide layers 127 and 131.

The second oxide layers 131 may further extend over the side surfaces of the mesa structures 507 to the top surface of the substrate 100. The second oxide layers 131 may also include a horizontally-extending portion 701 that extends partially over the top surface of the substrate 100. The second oxide layers 131 may have a thickness in the range of 5 nm to 20 nm, such as between about 9 nm and 13 nm, although greater or lesser thicknesses are within the contemplated scope of disclosure. In embodiments, the thickness of the second oxide layers 131 may be greater than the thickness of the first oxide layers 127.

Figure 8:
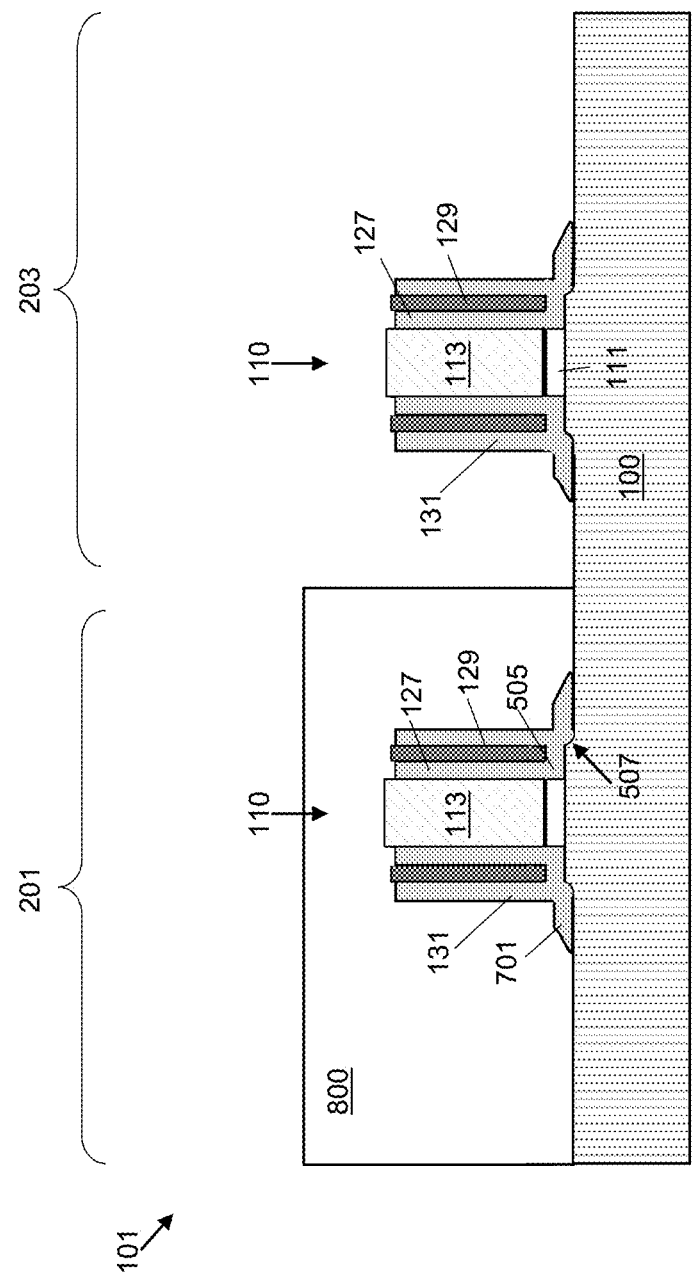
FIG. 8 is a vertical cross-sectional view illustrating a step of forming an etch mask over the gate structures in a memory region of the memory device while leaving the gate structures exposed in a logic region of the memory device.

FIG. 8 is a vertical cross-sectional view illustrating a step of forming an etch mask over the gate structures in a memory region of the memory device while leaving the gate structures exposed in a logic region of the memory device. Referring to FIG. 8, an etch mask 800 may be formed over the memory region 201 of the device 101. However, the etch mask 800 may not extend over the logic region 203 of the device 101, as shown in FIG. 8. The etch mask 800 may be formed by providing a continuous layer of photoresist over the memory region 201 and in the logic region 203, and lithographically patterning the photoresist to form the etch mask 800 over the memory region 201. As discussed above, the photoresist layer may be made of positive photoresist material, in which exposure to ultraviolet (UV) radiation makes polymers contained in the photoresist material more soluble and easier to remove, or negative photoresist material, in which exposure to UV radiation makes the polymers crosslink and harder to remove. The photoresist layer may be exposed to radiation (e.g., ultraviolet (UV) light) through a photolithography mask to transfer the mask pattern to the photoresist layer. The undesired photoresist material may then be removed to form the patterned etch mask 800.

Figure 9:
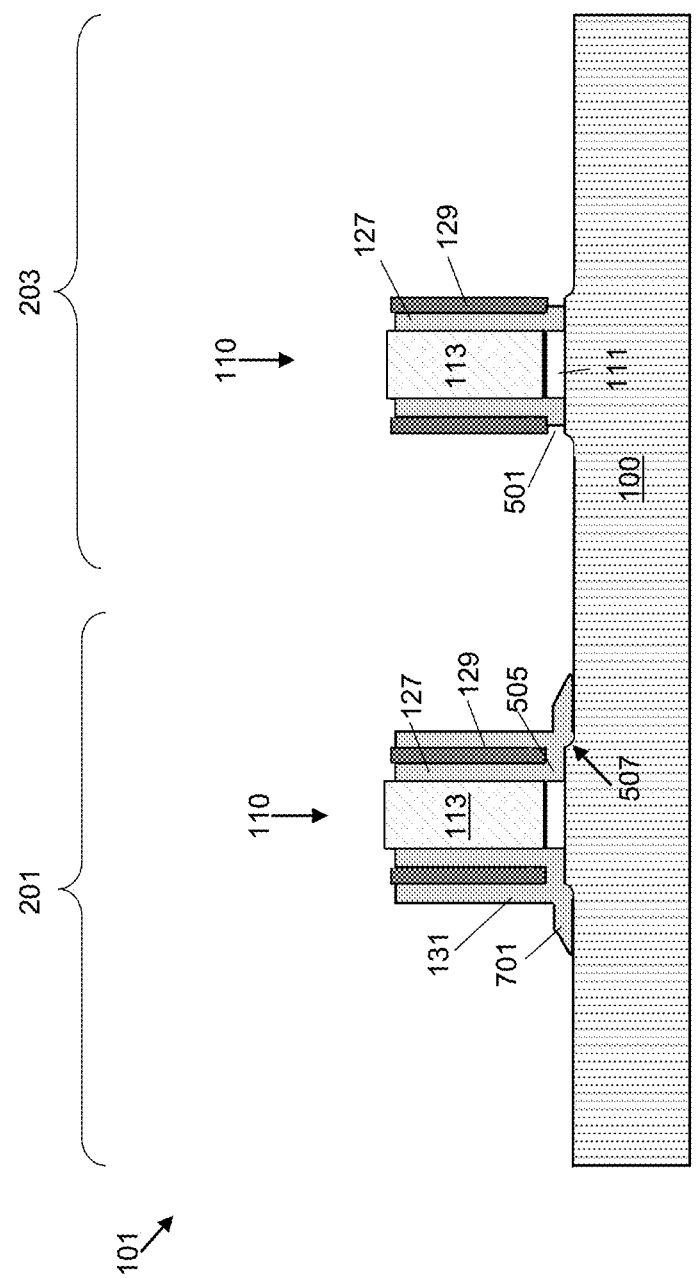
FIG. 9 is a vertical cross-sectional view illustrating a step of removing, via an etching process, the second oxide layers from the gate structures in the logic region of the memory device while the etch mask protects the second oxide layers on the gate structures of the memory region from being etched.

FIG. 9 is a vertical cross-sectional view illustrating a step of removing, via an etching process, the second oxide layers from the gate structures in the logic region of the memory device while the etch mask protects the second oxide layers on the gate structures of the memory region from being etched. Referring to FIG. 9, an etch process may be performed to remove the second oxide layers 131 from the gate structures 110 in the logic region 203 of the memory device 101. The etch mask 800 may protect the second oxide layers 131 in the memory region 201 from being removed during the etching process. The etch process may be a wet etch process, and may use an etchant having hydrofluoric acid. Following the etching process, the etch mask 800 may be removed, such as via ashing, dissolved or consumed in the etch process.

As shown in FIG. 9, the etching process may expose the first nitride layers 129 over the side surfaces of the gate structures 110 in the logic region 203. The etch process may also at least partially remove the horizontally extending portions 505 of the first oxide layers 127, such that bottom surfaces of first nitride layers 129 are partially exposed. In the memory region 201, however, the first and second oxide layers 127 and 131 may remain intact as well as the horizontally extending portions 505 of the first oxide layer 127, and the horizontally extending portions 701 of the second oxide layer 131.

Figure 10:
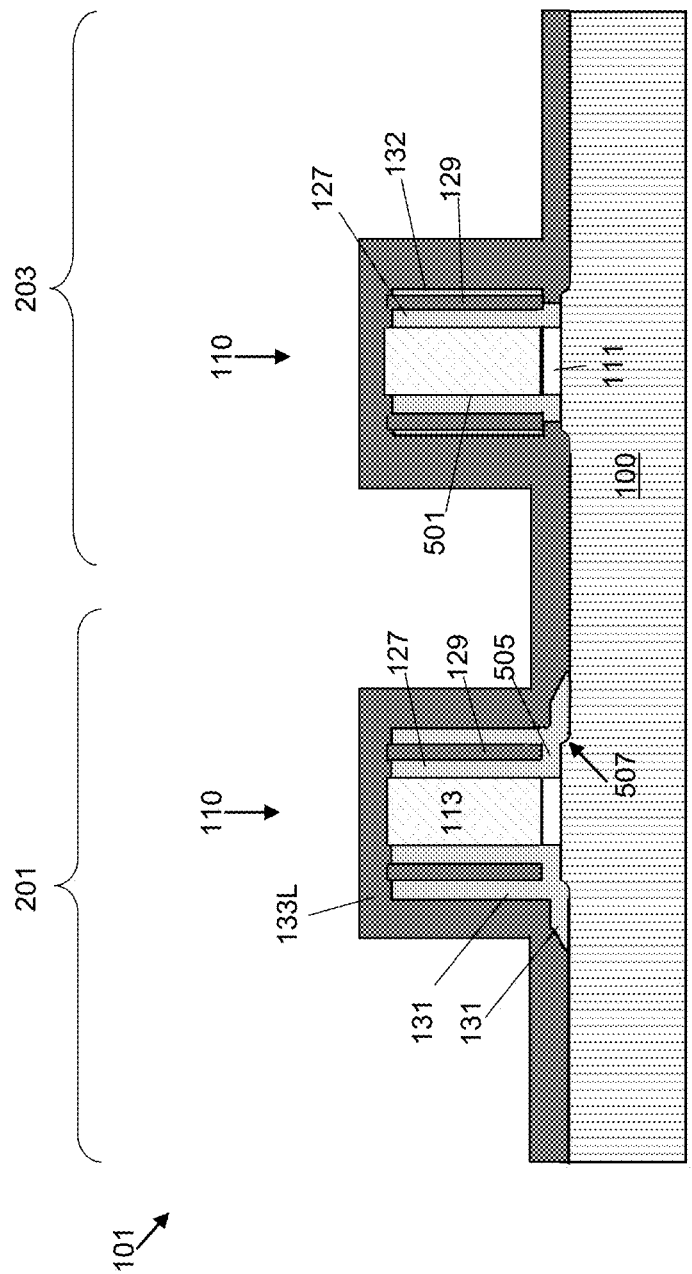
FIG. 10 is a vertical cross-sectional view illustrating a step of forming a second continuous nitride layer over the gate structures and the substrate in accordance with some embodiments.

FIG. 10 is a vertical cross-sectional view illustrating a step of forming a second continuous nitride layer over the gate structures and the substrate in accordance with some embodiments. Referring to FIG. 10, a second continuous nitride layer 133L may be formed over the gate structures 110 and the substrate 100. The second continuous nitride layer 133L may be made of silicon nitride ($Si_3N_4$). Other suitable nitride materials may be within the contemplated scope of the disclosure. The second continuous nitride layer 133 may be made of the same material or a different material than the material of the first nitride layer 129. The second continuous nitride layer 133L may be conformally deposited over the gate structures 110 and the substrate 100 using any suitable method, such as by chemical vapor deposition (CVD), plasma enhanced chemical vapor deposition (PECVD), organometallic chemical vapor deposition (OMCVD) or atomic layer deposition (ALD). The second continuous nitride layer 133L may have a thickness in the range of 20 nm to 50 nm, such as between about 30 nm and 45 nm, although greater or lesser thicknesses are within the contemplated scope of disclosure.

As shown in FIG. 10, in the memory region 201 of the device 101, the second continuous nitride layer 133L may be formed over the second oxide layer 131 along the side surfaces of the gate structures 110 and over the horizontally extending portions 701 of the second oxide layer 131. However, in the logic region 203 the second continuous nitride layer 133L may be formed over the first nitride layers 129 along the side surfaces of the gate structures 110. In some embodiments, a thin layer of native oxide material 132 may form over the exposed surfaces of the first nitride layers 129, and may be present between the first nitride layers 129 and the second continuous nitride layer 133L when the second continuous nitride layer 133L is formed over the first nitride layers 129. The layer of native oxide material 132 may have a thickness of less than 1.5 nm, such as between 1 nm and 1.5 nm.

Figure 11:
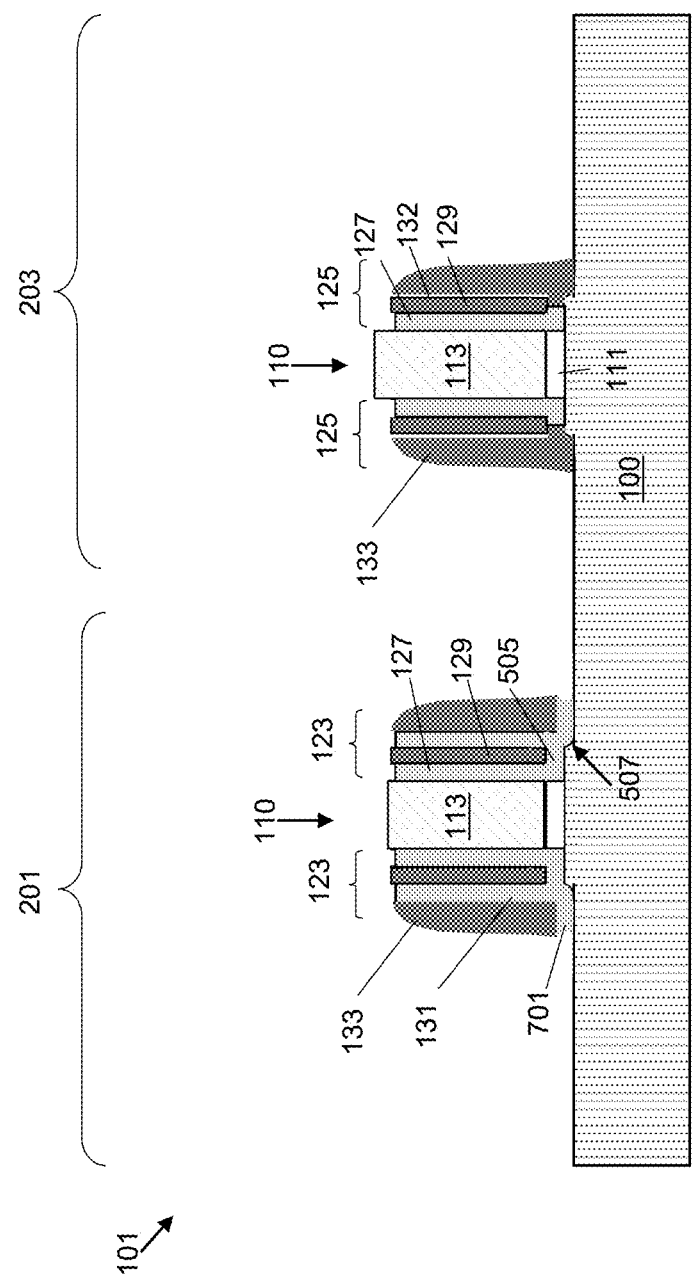
FIG. 11 is a vertical cross-sectional view illustrating a step of removing, via an etching process, portions of the second continuous nitride layer to form discrete second nitride layers over the side surfaces of the gate structures, where the second nitride layers are located over the second oxide layers in the memory region and the second nitride layers are located over the first nitride layers in the logic region.

FIG. 11 is a vertical cross-sectional view illustrating a step of removing, via an etching process, portions of the second continuous nitride layer to form discrete second nitride layers over the side surfaces of the gate structures, where the second nitride layers are located over the second oxide layers in the memory region and the second nitride layers are located over the first nitride layers in the logic region. Referring to FIG. 11, an anisotropic etch process, such as an anisotropic dry etch, may be performed to remove horizontal portions of the second continuous nitride layer 133L to expose the top surfaces of the gate structures 110 and portions of the substrate 100 between the gate structures 110. The remaining portions of the second continuous nitride layer 133L may form discrete second nitride layers 133. The second nitride layers 133 may have a thickness in the range of 20 nm to 50 nm, such as between about 30 nm and 45 nm, although greater or lesser thicknesses are within the contemplated scope of disclosure.

In the memory region 201 of the device 101, the second nitride layers 133 may be located over the second oxide layers 131. The first oxide layers 127, the first nitride layers 129, the second oxide layers 131 and the second nitride layers 133 may together form sidewall spacers 123 having an ONON structure. By contrast, in the logic region 203 of the device 101, the sidewall spacers 125 may be formed by the first oxide layers 127, the first nitride layers 129 and the second nitride layers 133 and may have an ONN structure.

The etching process may also partially recess the horizontally-extending portions 701 of the second oxide layer 131 in the memory region 201 of the device 101. In some embodiments, a lateral edge of the second nitride layer 133 may extend beyond and partially overhang a lateral edge of the horizontally-extending portion 701 of the second oxide layer 131.

In the memory region 201 of the device 101, the top surface of the gate structure 110 may extend above a top surface of each of the first oxide layer 127, the first nitride layer 129, the second oxide layer 131 and the second nitride layer 133. In some embodiments, the top surface of the first oxide layer 127 may also be at least partially recessed with respect to the top surface of the first nitride layer 129, and the top surface of the second oxide layer 131 may be at least partially recessed with respect to the top surfaces of both the first nitride layer 129 and the second nitride layer 133.

In the logic region 203 of the device 101, the top surface of the gate structure 110 may extend above a top surface of each of the first oxide layer 127, the first nitride layer 129 and the second nitride layer 133. The top surface of the gate structure 110 may extend above a top surfaces of each of the first oxide layer 127, the first nitride layer 129 and the second nitride layer 133 in the logic region 203 by a greater amount than the top surface of the gate structure 110 extends above the top surfaces of the first oxide layer 127, the first nitride layer 129 and the second nitride layer 133 in the memory region 201. For example, the top surface of the gate structure 110 in the logic region 203 may extend above the top surface of the sidewall spacers 125 by at least 40% more, such as at least 50% more, at least 65% more, or at least 80% more, than the top surface of the gate structure 113 in the memory region 201 extends above the top surface of the sidewall spacers 123. In one embodiment, the top surface of the gate structure 110 in the logic region 203 may extend above the top surface of the sidewall spacers 125 by at least 10 nm, such as between 10 nm and 15 nm, and the top surface of the gate structure 110 in the memory region 201 may extend above the top surface of the sidewall spacers 123 by less than 10 nm, such as between 5 nm and 9.5 nm.

Following the formation of the sidewall spacers 123 and 125, a dielectric material layer 135 (see FIG. 1) may be deposited over the gate structures 110 and sidewall spacers 123 and 125 using a suitable method, such as CVD. Then, a photoresist layer (not shown) may be deposited and patterned to use as a mask to form vias 137 for contact structures 139 (see FIG. 1) in the dielectric material layer 135. The vias 137 may be filled with metal, such as W, Cu, Co, Mo, Ru, other elemental metals, or an alloy or a combination thereof to form the contact structures 139.

Figure 12:
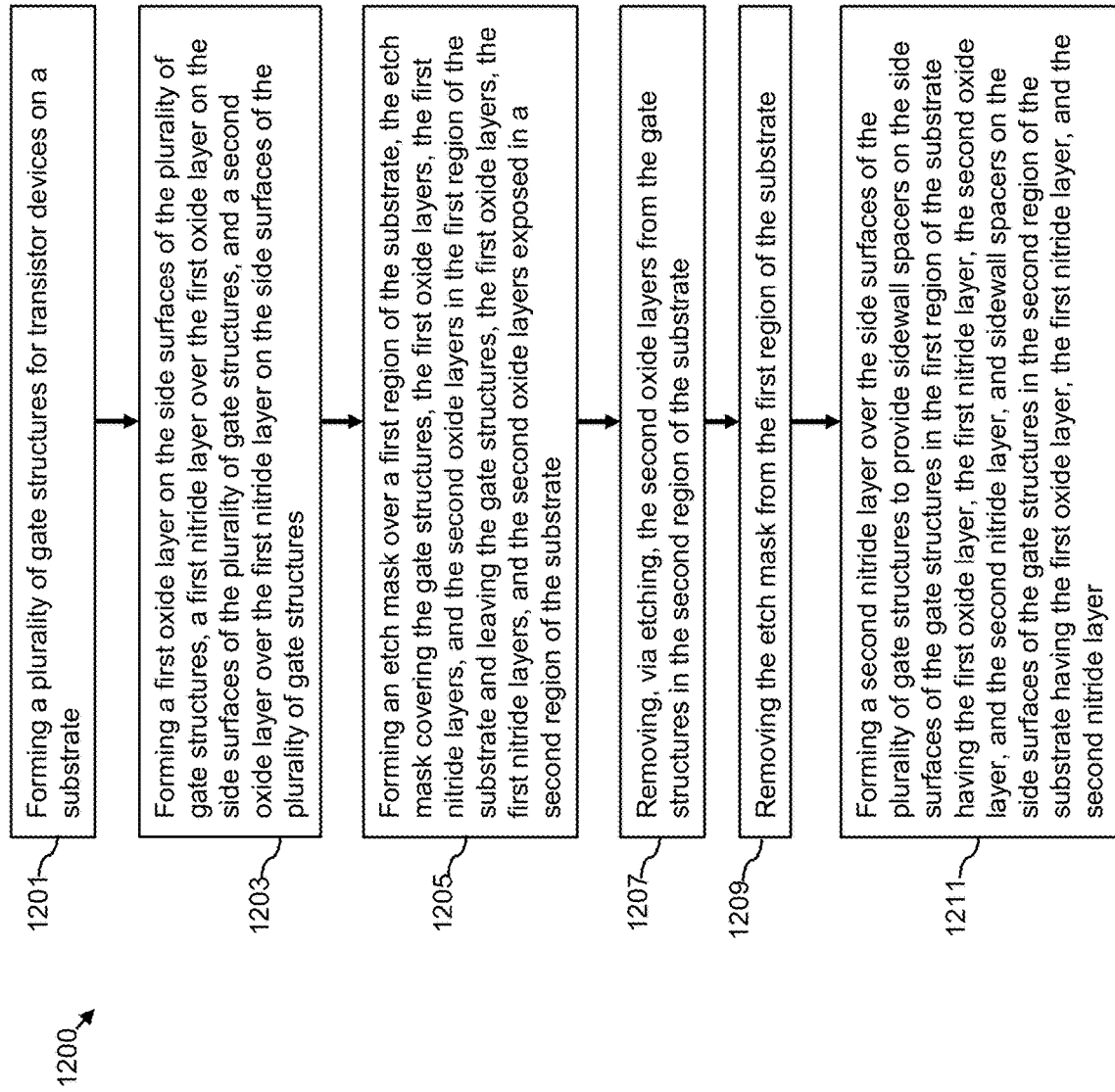
FIG. 12 is a flow chart of a method for fabricating a memory device in accordance with some embodiments.

FIG. 12 is a flowchart illustrating a general method 1200 of making a memory device 101 in which the transistors 103 in a memory region 201 of the device 101 include a sidewall spacer 123 for a gate structure 110 that include a first oxide layer 127 formed over a side surface of the gate structure 110, a first nitride layer 129 formed over the first oxide layer 127, a second oxide layer 131 formed over the first nitride layer 129, and a second nitride layer 133 formed over the second oxide layer 131. Referring to FIGS. 2 and 12, in step 1201 a plurality of gate structures 110 for transistor devices 103, 105 may be formed on a substrate 100. Referring to FIGS. 3-7 and 12, in step 1203, a first oxide layer 127 may be formed on the side surfaces 501, 503 of the gate structures 110, a first nitride layer 129 may be formed over the first oxide layer 127 on the side surfaces 501, 503 of the gate structures 110, and a second oxide layer 131 may be formed over the first nitride layer 129 on the side surfaces 501, 503 of the gate structures 110.

Referring to FIGS. 8 and 12, in step 1205 of method 1200, an etch mask 800 may be formed over a first region 201 of the substrate 100. The etch mask 800 may cover the gate structures 110, the first oxide layers 127, the first nitride layers 129, and the second oxide layers 131 in the first region 201 of the substrate 100 and may leave the gate structures 110, the first oxide layers 127, the first nitride layers 129, and the second oxide layers 131 exposed in a second region 203 of the substrate 100. Referring to FIGS. 9 and 12, in step 1207, the second oxide layers 131 may be removed from the gate structures 110 in the second region 203 of the substrate 100 via etching. The etch mask 800 may then be removed from the first region 201 of the substrate 100 in step 1209.

Referring to FIGS. 10-12, in step 1211, a second nitride layer 133 may be formed over the side surfaces 501, 503 of the plurality of gate structures 110 to provide sidewall spacers 123 on the side surfaces 501, 503 of the gate structures 110 in the first region 201 of the substrate 100 having the first oxide layer 127, the first nitride layer 129, the second oxide layer 131, and the second nitride layer 133, and sidewall spacers 125 on the side surfaces 501, 503 of the gate structures 110 in the second region 203 of the substrate 100 having the first oxide layer 127, the first nitride layer 129, and the second nitride layer 133.

Referring to all drawings and according to various embodiments of the present disclosure, a memory device 101 is provided, wherein the memory device 101 includes a substrate 100 and a plurality of transistor devices 103, 105 on the substrate 100. The memory device 101 may include at least one transistor device 103 located in a memory region 201 of the memory device 101 and at least one transistor device 105 located in a logic region 203 of the memory device 101. Each transistor device 103, 105 may include a source 119, a drain 121, a channel 115 extending between the source 119 and the drain 121, a gate structure 110 over the channel 115, and at least one sidewall spacer 123, 125 located on a side surface 501, 503 of the gate structure 110. Each sidewall spacer 123 of a transistor device 103 in the memory region 201 of the memory device 101 may include a first oxide layer 127 over a side surface 501, 503 of the gate structure 110, a first nitride layer 129 over the first oxide layer 127, a second oxide layer 131 having a thickness of at least 5 nm over the first nitride layer 129, and a second nitride layer 133 over the second oxide layer 131.

In one embodiment memory device 101, each sidewall spacer 125 of the at least one transistor device in the logic region 203 of the memory device 101 includes a first oxide layer 127 over the side surface 501, 503 of the gate structure 110, a first nitride layer 129 over the first oxide layer 127, and a second nitride layer 133 over the first nitride layer 129.

In one embodiment memory device 101, each sidewall spacer 125 of the at least one transistor device in the logic region 203 of the memory device 101 has either no oxide layer between the first nitride layer 129 and the second nitride layer 133 or has a layer 128 of native oxide material having a thickness of less than 1.5 nm between the first nitride layer 129 and the second nitride layer 133.

In one embodiment memory device 101, each transistor device of the plurality of transistor devices includes two sidewall spacers 123, 125 located on opposite side surfaces of the gate structure 110.

In one embodiment memory device 101, the at least one transistor device located in the memory region 201 of the memory device includes a plurality of transistor devices forming memory cells of the memory device 101.

In one embodiment memory device 101, the at least one transistor device located in the logic region 203 of the memory device 101 includes a plurality of transistor devices forming logic devices of the memory device 101, where the logic devices include at least one of memory selectors, power gates and input/output elements. In one embodiment memory device 101, the memory device includes a multi-time programmable (MTP) memory device.

In one embodiment memory device 101, in each sidewall spacer in the memory region 201 of the memory device 101, the first oxide layer 127 includes a horizontally extending portion 505 beneath the first nitride layer 129 to the second oxide layer 131 such that the first nitride layer 129 is surrounded on three sides by the first oxide layer 127 and the second oxide layer 131.

In one embodiment memory device 101, the substrate 100 includes a plurality of raised mesa structures 507, and the gate structures 110 and at least a portion of the sidewall spacers 123, 125 are located on the raised mesa structures 507.

In one embodiment memory device 101, in each sidewall spacer 123 in the memory region 201 of the memory device 101, the first oxide layer 127 and the first nitride layer 129 are located on the raised mesa structure 507 and the second oxide layer 131 extends over the first nitride layer 129 and along a side wall of the raised mesa structure 507 to a top surface of the substrate 100.

In one embodiment memory device 101, the first oxide layer 127 has a thickness in a range of 2 nm to 10 nm, and the second oxide layer 131 has a thickness in a range of 5 nm to 20 nm. In one embodiment memory device 101, the first nitride layer 129 has a thickness in a range of 5 nm to 15 nm, and the second nitride layer 133 has a thickness in a range of 20 nm to 50 nm. In one embodiment memory device 101, the first oxide layer 127 and the second oxide layer 131 include silicon dioxide and the first nitride layer 129 and the second nitride layer 133 include silicon nitride.

Another embodiment is drawn to a memory device 101 including a substrate 100, a first transistor 103 on a first region 201 of the substrate 100 and a second transistor 105 on a second region 203 of the substrate 100, where the first transistor 103 includes a first sidewall spacer 123 located on a side surface 501 of a gate structure 110 of the first transistor 103 that includes a first oxide layer 127 over the side surface 501 of the gate structure 110, a first nitride layer 129 over the first oxide layer 127, a second oxide layer 131 over the first nitride layer 129, and a second nitride layer 133 over the second oxide layer 131, and where the second transistor 105 includes a second sidewall spacer 125 located on a side surface 501 of a gate structure 110 of the second transistor 105 that includes a first oxide layer 127 over the side surface 501 of the gate structure 110, a first nitride layer 129 over the first oxide layer 127, and a second nitride layer 133 over the first nitride layer 129, and a distance between the first nitride layer 129 and the second nitride layer 133 in the first sidewall spacer 123 is greater than a distance between the first nitride layer 129 and the second nitride layer 133 in the second sidewall spacer 125.

In one embodiment memory device 101, the second sidewall spacer 125 includes a second oxide layer 132 between the first nitride layer 129 and the second nitride layer 133, and a thickness of the second oxide layer 131 in the first sidewall spacer 123 is greater than a thickness of the second oxide layer 132 in the second sidewall spacer 125.

In one embodiment memory device 101, a top surface of the gate structure 110 of the second transistor 105 extends above a top surface of the second sidewall spacer 125 by a greater amount than a top surface of the gate structure 110 of the first transistor 103 extends above a top surface of the first sidewall spacer 123.

Another embodiment is drawn to a method of making a memory device 101 including forming a plurality of gate structures 110 for transistor devices 103, 105 on a substrate 100, forming a first oxide layer 127 on the side surfaces 501, 503 of the plurality of gate structures 110, a first nitride layer 129 over the first oxide layer 127 on the side surfaces 501, 503 of the plurality of gate structures 110, and a second oxide layer 131 over the first nitride layer 129 on the side surfaces 501, 503 of the plurality of gate structures 110. The method additionally includes forming an etch mask 800 over a first region 201 of the substrate 100, where the etch mask 800 covers the gate structures 110, the first oxide layers 127, the first nitride layers 129, and the second oxide layers 131 in the first region 201 of the substrate 100 and leaves the gate structures 110, the first oxide layers 127, the first nitride layers 129, and the second oxide layers 131 exposed in a second region of the substrate. The method also includes removing, via etching, the second oxide layers 131 from the gate structures 110 in the second region 203 of the substrate, removing the etch mask 800 from the first region 201 of the substrate 100, and forming a second nitride layer 133 over the side surfaces 501, 503 of the plurality of gate structures 100 to provide sidewall spacers 123 on the side surfaces 501, 503 of the gate structures 110 in the first region 201 of the substrate 100 having the first oxide layer 127, the first nitride layer 129, the second oxide layer 131, and the second nitride layer 133, and sidewall spacers 125 on the side surfaces 501, 503 of the gate structures 110 in the second region 203 of the substrate 100 having the first oxide layer 127, the first nitride layer 129, and the second nitride layer 133.

In one embodiment method, the step of forming a first oxide layer 127 on the side surfaces 501, 503 of the plurality of gate structures 110, a first nitride layer 129 over the first oxide layer 127 on the side surfaces 501, 503 of the plurality of gate structures 110, and a second oxide layer 131 over the first nitride layer 129 on the side surfaces 501, 503 of the plurality of gate structures 110 may include: forming a continuous first oxide layer 127L over the gate structures 110 and the substrate 100; forming a continuous first nitride layer 129L over the continuous first oxide layer 127L; removing, by etching, portions of the continuous first oxide layer 127L and the continuous first nitride layer 129L from over the top surfaces of the gate structures 110 and from over the top surface of the substrate 100 to provide discrete first oxide layers 127 on the side surfaces 501, 503 of the plurality of gate structures 110 and discrete first nitride layers 129 over the discrete first oxide layers 127; forming a continuous second oxide layer 131L over the gate structures 110 and the substrate 100; and removing, by etching, portions of the continuous second oxide layer 131L from over the top surfaces of the gate structures 110 and from over the top surface of the substrate 100 to provide discrete second oxide layers 131 over the first nitride layers 129 on the side surfaces 501, 503 of the plurality of gate structures 110.

In one embodiment method, the step of forming an etch mask 800 over a first region of the substrate includes: forming a continuous layer of photoresist over the first region 201 and the second region 203 of the substrate 100;

and lithographically patterning the continuous layer of photoresist to form the etch mask 800 over the first region 201 of the substrate 100.

In one embodiment method, the step of forming a second nitride layer 133 over the side surfaces 501, 503 of the plurality of gate structures 110 includes: forming a continuous second nitride layer 133L over the gate structures 110 and the substrate 100; and removing, by etching, portions of the continuous second nitride layer 133L from over the top surfaces of the gate structures 110 and from over the top surface of the substrate 100 to provide discrete second nitride layers 133 over the second oxide layers 131 in the first region 201 of the substrate 100 and discrete second nitride layers 133 over the first nitride layers 129 in the second region 203 of the substrate 100.

By forming the memory device 101 that includes the ONON spacer structure that includes the first oxide layer 127, the first nitride layer 129, the second oxide layer 131 and the second nitride layer 133, the devices formed in the memory region 201 of the memory device 101 may improve data retention in a MTP device with an impact on the performance of device formed in the logic region 203 of the memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a source;
a drain;
a channel extending between the source and the drain;
a gate structure over the channel; and
a sidewall spacer located on a side surface of the gate structure, the sidewall spacer comprising a first oxide layer over the side surface of the gate structure, a first nitride layer over the first oxide layer, a second oxide layer having a thickness of at least 5 nm over the first nitride layer, and a second nitride layer over the second oxide layer.

2. The semiconductor device of claim 1, wherein the semiconductor device comprises a memory device.

3. The semiconductor device of claim 2, wherein the memory device comprises a multi-time programmable (MTP) memory device.

4. The semiconductor device of claim 1, wherein the first oxide layer includes a portion extending beneath the first nitride layer to the second oxide layer such that the first nitride layer is surrounded on three sides by the first oxide layer and the second oxide layer.

5. The semiconductor device of claim 1, further comprising a substrate comprising a raised mesa structure, wherein the gate structure and at least a portion of the sidewall spacer is located on the mesa structure.

6. The semiconductor device of claim 5, wherein the first oxide layer and the first nitride layer are located on the raised mesa structure and the second oxide layer extends over the first nitride layer and along a side wall of the raised mesa structure to a top surface of the substrate.

7. The semiconductor device of claim 6, wherein the second oxide layer comprises a horizontally-extending portion that extends from the side wall of the raised mesa structure over the top surface of the substrate.

8. The semiconductor device of claim 7, wherein the horizontally-extending portion of the second oxide layer extends between a lower surface of the second nitride layer and the top surface of the substrate.

9. The semiconductor device of claim 1, wherein the thickness of the second oxide layer is greater than a thickness of the first oxide layer.

10. The semiconductor device of claim 1, wherein the second oxide layer has a thickness of 20 nm or less.

11. The semiconductor device of claim 1, wherein the first oxide layer has a thickness in a range of 2 nm to 10 nm.

12. The semiconductor device of claim 1, wherein the first nitride layer has a thickness in a range of 5 nm to 15 nm and the second nitride layer has a thickness in a range of 20 nm to 50 nm.

13. The semiconductor device of claim 1, wherein the sidewall spacer is located over two opposite side surfaces of the gate structure.

14. A semiconductor device comprising:
a gate structure over a substrate; and
a sidewall spacer located on a side surface of the gate structure, the sidewall spacer comprising a first oxide layer over the side surface of the gate structure, a first nitride layer over the first oxide layer, a second oxide layer over the first nitride layer, and a second nitride layer over the second oxide layer, wherein the first oxide layer includes a portion extending beneath the first nitride layer to the second oxide layer such that the first nitride layer is surrounded on three sides by the first oxide layer and the second oxide layer.

15. The semiconductor device of claim 14, wherein a thickness of the second oxide layer is greater than a thickness of the first oxide layer.

16. The semiconductor device of claim 14, wherein the second oxide layer comprises a horizontally-extending portion that contacts the portion of the first oxide layer extending beneath the first nitride layer and extends beneath the second nitride layer.

17. The semiconductor structure of claim 16, wherein the substrate comprises a raised mesa structure, the gate structure is located on the raised mesa structure, the horizontally-extending portion of the second oxide layer extends from a sidewall of the raised mesa structure beneath the second nitride layer.

18. A method of making a semiconductor device comprising:
forming a gate structure on a substrate;
forming a first oxide layer on a side surface of the gate structure;
forming a first nitride layer over the first oxide layer on the side surface of the gate structure;
forming a second oxide layer having a thickness of at least 5 nm over the first nitride layer on the side surface of the gate structure; and
forming a second nitride layer over the second oxide layer to provide a sidewall spacer on the side surface of the gate structure.

19. The method of claim 18, wherein forming the first oxide layer and the first nitride layer comprises:
depositing a continuous first oxide layer over the gate structures and the substrate;

depositing a continuous first nitride layer over the continuous first oxide layer;

removing, by etching, horizontally-extending portions of the continuous first oxide layer and the continuous first nitride layer from over a top surface of the gate structures and from over the top surface of the substrate to provide a discrete first oxide layer on a side surface of the gate structure and a discrete first nitride layer over the discrete first oxide layer, wherein the first nitride layer protects a horizontally-extending portion of the first oxide layer underlying the first nitride layer from being etched.

20. The method of claim 18, wherein forming the second oxide layer comprises:

depositing a continuous second oxide layer over the upper surfaces of the gate structure, the first oxide layer, and the first nitride layer, over the side surface of the first nitride layer, over the upper surface of the substrate, and contacting the horizontally-extending portion of the first oxide layer underlying the first nitride layer such that the first nitride layer is surrounded on opposite lateral side surfaces and a bottom surface of the first nitride layer by the first oxide layer and the second oxide layer.

* * * * *